(12) United States Patent
Baba et al.

(10) Patent No.: US 6,770,319 B2
(45) Date of Patent: Aug. 3, 2004

(54) RESIN COATING METHOD

(75) Inventors: Shunji Baba, Kawasaki (JP); Takatoyo Yamakami, Kawasaki (JP); Norio Kainuma, Kawasaki (JP); Kenji Kobae, Kawasaki (JP); Hidehiko Kira, Kawasaki (JP); Hiroshi Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/811,605

(22) Filed: Mar. 20, 2001

(65) Prior Publication Data

US 2002/0037363 A1 Mar. 28, 2002

(30) Foreign Application Priority Data

Sep. 26, 2000 (JP) .......................................... 2000-293013

(51) Int. Cl.[7] .............................. B05D 5/12; B23K 31/00
(52) U.S. Cl. ................................ 427/8; 427/10; 427/240; 427/256; 427/96; 228/180.22
(58) Field of Search ......................... 427/96, 8, 10, 427/256, 240; 228/180.21, 180.22

(56) References Cited

U.S. PATENT DOCUMENTS

| 5,377,961 | A | * | 1/1995 | Smith et al. ............. 266/237 |
| 5,855,323 | A | * | 1/1999 | Yost et al. ............... 239/135 |
| 6,213,356 | B1 | * | 4/2001 | Nakasu et al. ........... 220/590 |
| 6,319,317 | B1 | * | 11/2001 | Takamori ................. 118/52 |
| 6,491,452 | B2 | * | 12/2002 | Konishi et al. .......... 396/611 |

FOREIGN PATENT DOCUMENTS

| JP | 120276 | * | 4/1994 |
| JP | 6-120276 | | 4/1994 |

* cited by examiner

Primary Examiner—Brian K. Talbot
(74) Attorney, Agent, or Firm—Staas & Halsey LLP

(57) ABSTRACT

A resin coating method for applying resin to a predetermined region of a wiring board includes the steps of imaging an external appearance of the resin extruded from a resin application device; and automatically adjusting an amount of the resin extruded from the resin application device based on the external appearance of the resin obtained in the imaging step.

12 Claims, 12 Drawing Sheets

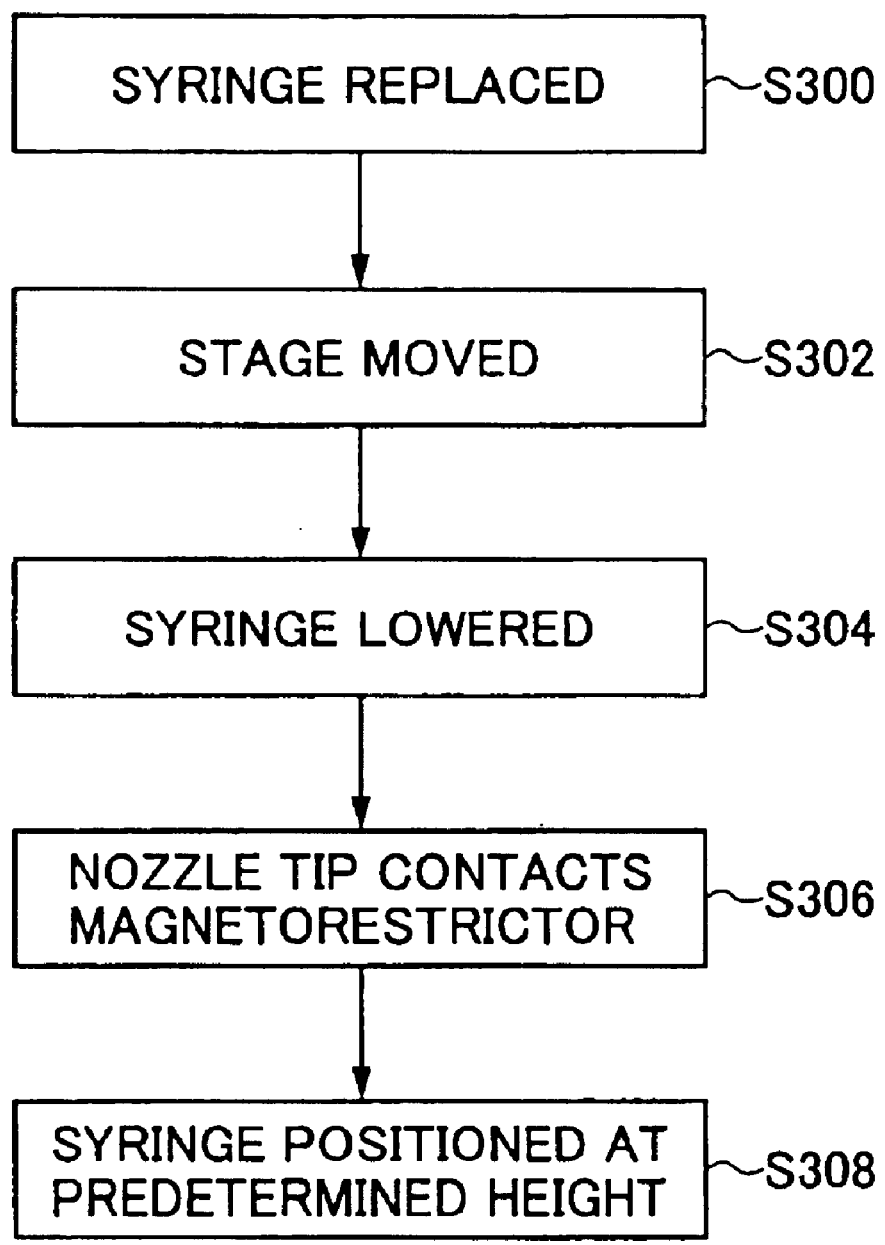

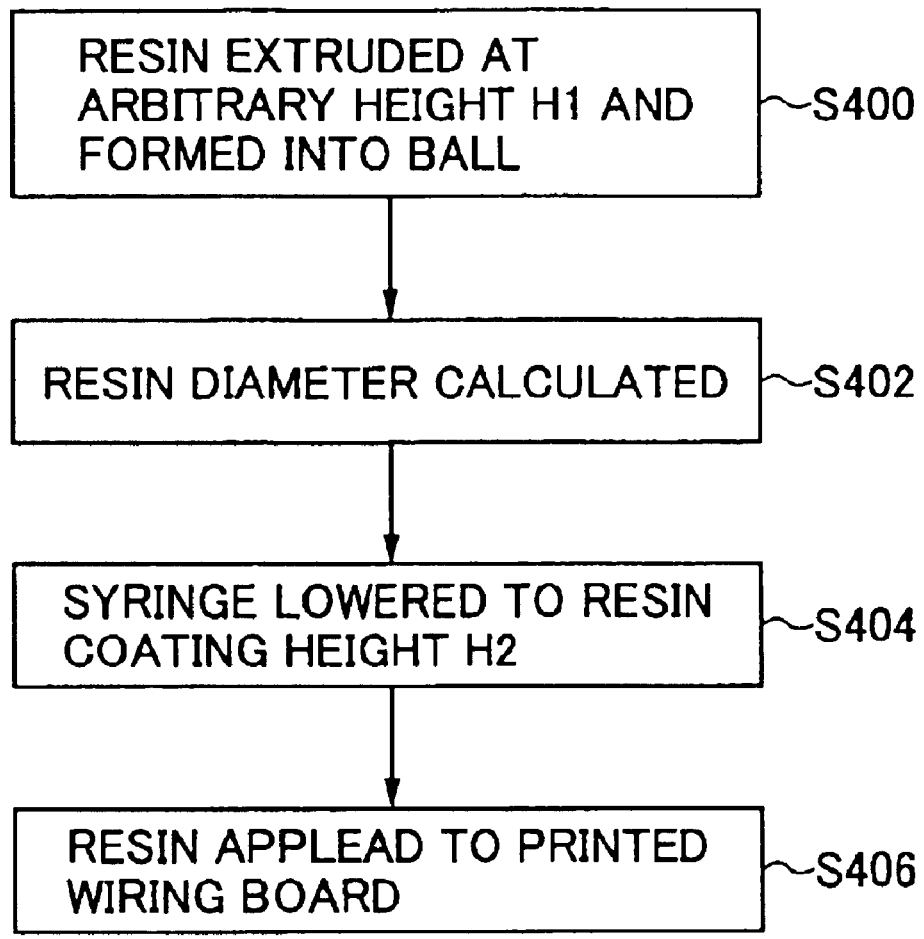

RESIN COATING METHOD

BACKGROUND OF THE INVENTION

1. Field of the Invention

The present invention relates to a resin coating method and apparatus for applying resin to a predetermined region of a printed wiring board.

2. Description of Related Art

Conventionally, the production of semiconductor devices, in which semiconductor elements are mounted on a printed wiring board, involves the insertion of an insulating resin between the printed wiring board pad and the semiconductor bump and, further, the use of insulating resin in regions of the printed wiring board that include leads. This so-called underfill is intended to protect the circuit surface and to strengthen the bond between the semiconductor and the printed wiring board.

Generally, there are two main methods of applying the insulating resin (hereinafter simply resin): Injecting the resin between the printed wiring board and the semiconductor elements after the semiconductor elements have been mounted on the printed wiring board, and mounting the semiconductor elements on a printed wiring board that has already been coated with resin.

Of the two methods of application, the latter is further divided into exposure and stamp methods.

The exposure method involves spraying drops of resin from a nozzle that is moved over the surface of the printed wiring board, covering a predetermined region with a coating having a thickness, for example, of approximately 50–100 $\mu$m.

By contrast, the stamp method involves dropping a predetermined amount of resin from a nozzle onto a central portion of the printed wiring board and then using the force with which the semiconductor elements are mounted on the printed wiring board to spread the resin over a predetermined region with a coating having a thickness, for example, of approximately 10–100 $\mu$m.

The stamp method of application has come to be used with less frequency for large semiconductor elements with surface dimensions on the order of millimeters, being optimally suited to smaller semiconductor elements having surface dimensions of 0.3 mm or less.

An example of the mounting of such smaller semiconductor elements on a printed wiring board is shown in FIG. 1, which shows a head slider assembly for a hard disk drive. In this case, a head IC chip 1 is mounted on a printed wiring board suspension 2.

In such a case, the resin application device is usually a dispenser (not shown in the diagram) having a syringe filled with resin, the dispenser being able to raise and lower the syringe.

In order to apply the resin, a nozzle on a lower part of the syringe is positioned at a predetermined height above a surface of the suspension 2 and a predetermined amount of resin 3 is extruded from the syringe by compressed air. The extruded resin 3 is substantially spherical in shape, and contacts and adheres to the suspension 2. When the syringe is lifted the resin 3 separates from the syringe and spreads across a predetermined position on the surface of the suspension 2. Thereafter a head IC chip 1 is positioned above and pressed onto the suspension, thus further spreading the resin 3 as well as adhering and fixedly mounting the head IC chip 1 onto the suspension 2.

More specifically, as can be seen in FIG. 1, a wiring pattern 4 may be formed on a top surface of the suspension 2 and a gold pad 5 may be formed at an edge portion of the wiring pattern 5. At the same time, a gold bump 6 may be formed on a bottom surface of the head IC chip 1. The gold pad 5 and the gold bump 6 are coupled and a predetermined region between the head IC chip 1 and the suspension 2 including the gold pad 5 and the gold bump 6 is covered with the resin 3.

A plurality of suspensions 2 may for example be set atop a stage at a resin application device and the suspensions 2 subjected to the above-described coating process. In this case, in order to resin-coat a predetermined product lot with a predetermined amount of resin, the resin application device is set to specific conditions at the start of coating. When after repeated coating the resin is used up, a new syringe is installed.

In the above-described case, the head IC chip 1 is, for example, just 1×1 mm, and so the amount of resin used in the coating is, for example, approximately 0.05 mg. Such small amounts over such small surfaces requires precision in the application of the resin 3.

However, because the amount of resin 3 involved in individual applications is small, it can happen that slight changes in ambient conditions during application, such as, for example, slight changes in temperature, causes slight changes in the amount of resin 3 applied, despite the resin application device being set to predetermined conditions beforehand.

Conventionally, in order to maintain the amount of resin 3 to be applied at the predetermined volume, a visual inspection is made of the amount of resin, if any, protruding from the edges of the semiconductor elements in a state in which the printed wiring board has been coated and the semiconductor elements mounted thereon in order to determine if too much resin or too little resin is being applied, after which the resin amount is adjusted as necessary. Additionally, visual inspection of the resin drop just before it separates from the nozzle or the external appearance of the resin 3 coating the stage are also used to determine the presence of change in the amount of resin applied.

However, the very small amounts of resin involved make it difficult to discern changes in that amount by the conventional methods. In addition, adjustment of the amount is often left to the discretion of an operator, which means it is often done manually and at arbitrary times. Such methods of adjustment are unsuited to cases in which the amount of resin applied changes continuously due to a variety of environmental and other factors.

BRIEF SUMMARY OF THE INVENTION

Accordingly, it is an object of the present invention to provide an improved and useful resin coating method and apparatus in which the above-described disadvantage is eliminated.

The above-described object of the present invention is achieved by a resin coating method for applying resin to a predetermined region of a printed wiring board comprising the steps of:

imaging an external appearance of the resin extruded from a resin application device; and automatically adjusting an amount of the resin extruded from the resin application device based on the external appearance of the resin obtained in the imaging step.

The above-described object of the present invention is also achieved by a resin coating apparatus for applying resin to a predetermined region of a printed wiring board, comprising:

an imaging unit for imaging an external appearance of the resin extruded from the resin coating apparatus; and an automatic adjustment unit for automatically adjusting an amount of the resin extruded from the resin coating apparatus based on the external appearance of the resin obtained in the imaging step.

According to the above-described aspects of the present invention, the amount of resin expelled, in other words, the amount of resin to be used to coat the printed wiring board, is set according to the dimensions of the semiconductor elements mounted on the printed wiring board. The present invention is most effective with semiconductor elements measuring not more than 0.3 mm a side, though it is not limited to use with semiconductor elements of such dimensions.

A preferred method for automatically adjusting the amount of resin extruded from the resin coating apparatus is one in which a difference between a preset coating amount and an actual coating amount as determined by the external appearance of the resin is sensed and this difference used as feedback to adjust the amount of resin extruded. In this case, it is preferable that relational data relating the external appearance of the resin and the coating amount be stored as a reference table in the resin coating apparatus. An ordinary camera can suffice for use as the imaging device. As a method of adjusting the amount of resin extruded, it is preferable to regulate either the pressure of compressed air used to expel the resin, and/or the amount of time during which that flow of air continues. For accuracy and ease of control, regulating the timing of the air flow is preferable.

It should be noted that the foregoing can be applied to any or all of the embodiments to be described later.

It will be appreciated by those of skill in the art that the factors that directly affect the amount of resin extruded from the syringe and cause it to vary from a predetermined desired amount include but are not limited to changes in air pressure, changes in temperature, and changes in the viscosity of the resin due to changes in the components of the resin over time.

However, according to the above-described aspects of the present invention, the amount of resin extruded can be quickly and accurately adjusted as necessary.

Additionally, the above-described object of the present invention is also achieved by a resin coating method for applying resin to a predetermined region of a printed wiring board, comprising the steps of:

measuring a temperature of an extrusion nozzle of a resin application device; and automatically adjusting an amount of the resin extruded from the resin application device based on the temperature of the nozzle.

According to this aspect of the invention, an appropriate temperature sensor can be used to measure the temperature of the extrusion nozzle, and the method of adjustment may be either manual or automatic.

Additionally, adjustments in the amount of resin extruded necessitated by changes in the amount of resin extruded from the extrusion nozzle due to a change in the viscosity of the resin caused by a change in the temperature of the nozzle can be performed relatively easily, on the basis of the temperature data. Additionally, if in this case the amount of resin extruded is adjusted automatically, then the amount of resin extruded can be quickly and accurately adjusted as necessary.

Additionally, the above-described object of the present invention is also achieved by a resin coating method for applying a resin to a predetermined region of a printed wiring board comprising positioning an extrusion nozzle of a resin application device at a predetermined reference height.

The reference height is not particularly limited. However, in terms of eliminating with certainty those elements that cause the amount of resin extruded to vary, controlling the height of the nozzle with respect to the printed wiring board on which the resin coating is to be applied is desirable. In this case, for example, a glass plate may be placed at a height identical to a height at which the printed wiring board is positioned, with an upper surface of the glass plate serving as a reference surface. The extrusion nozzle from which resin is extruded may then be contacted against the reference surface so as to adjust the nozzle to a reference height. The contact may be detected by a variety of suitable methods, including use of a magnetorestrictor to detect the presence of an electric current when pressure is applied or by using a light-emitting element and a light-receiving element to detect when the light is cut off. By programming the resin application device to raise and lower the syringe (or resin extrusion nozzle, as the case may be) according to a set schedule, the reference height contained in that program can be replaced with a newly obtained reference height.

According to the above-described aspect of the invention, the extrusion nozzle is positioned at a predetermined height when mounted on the resin application device, so the distance between the extrusion nozzle and the printed wiring board does not change even when, for example, the syringe containing the resin becomes empty and is replaced with a new syringe in an operation that can cause the height at which the extrusion nozzle is positioned to vary.

As a result, in the present invention the distance between the nozzle and the printed wiring board is set to a predetermined value and hence the volume of resin extruded does not change, hence avoiding a situation in which the height of the nozzle changes, and accordingly, the distance between the tip of the nozzle and the printed wiring board changes, such that when that distance exceeds a predetermined value the amount of resin extruded also exceeds a predetermined amount, and conversely, when that distance falls below a predetermined value the amount of resin extruded also decreases below a predetermined amount.

The above-described object of the present invention is also achieved by a resin coating method for applying resin to a predetermined region of a printed wiring board, comprising the steps of:

imaging an external appearance of a resin drop after the resin drop has been extruded from a nozzle of a resin application device but before the resin drop contacts the printed wiring board; and adjusting a distance between a tip of the nozzle and the printed wiring board based on the external appearance of the resin drop obtained in the imaging step.

If for some reason the distance between the nozzle and the printed wiring board becomes too short, then when the nozzle is lifted after coating the printed wiring board resin remains on the tip of the nozzle. If such a condition persists, then at some point during the coating process the amount of residual resin remaining on the tip of the nozzle peels off therefrom, coating the printed wiring board with an abnormally large amount of resin.

However, according to the above-described aspect of the present invention, adhesion of excess resin to the tip of the nozzle can be prevented by, for example, substantially matching the distance between the tip of the nozzle and the printed wiring board to a diameter of the drops of resin. In this case, it would be even more desirable to compile a database relating resin drop diameter to optimal distance between the nozzle and the printed wiring board so as to automatically adjust the distance to the diameter.

Additionally, the above-described object of the present invention is also achieved by a resin coating method for applying resin to a predetermined region of a printed wiring board, comprising the steps of:

imaging a residual amount of the resin on an extrusion nozzle of a resin application device from which the resin is expelled; and washing the nozzle when the residual amount exceeds a predetermined amount.

According to this aspect of the invention, by washing the nozzle before the coating amount varies from a desired amount, imperfections in the coating can be avoided.

In this case, any of a variety of suitable methods for washing the nozzle can be employed, including removing the residual resin by air blower, by wiper, by immersion in a washing solution or by melting the residual resin off.

Other objects, features and advantages of the present invention will become more apparent from the following detailed description when read in conjunction with the accompanying drawings.

BRIEF DESCRIPTION OF THE DRAWINGS

FIG. 9 is a flow chart showing steps in a resin coating method according to the third embodiment of the present invention;

FIGS. 10A and 10B are diagrams of a resin coating apparatus used to perform a resin coating method according to a fourth embodiment of the present invention, in which FIG. 10A shows a state prior to coating and FIG. 10B shows a state at time of coating;

FIG. 11 is a flow chart showing steps in a resin coating method according to the fourth embodiment of the present invention;

DETAILED DESCRIPTION OF THE INVENTION

A description will now be given of embodiments of the present invention, with reference to the accompanying drawings. It should be noted that identical or corresponding elements in the embodiments are given identical or corresponding reference numbers in all drawings, with detailed descriptions of such elements given once and thereafter omitted.

In order to facilitate an understanding of the invention, a description will first be given of a process of manufacturing a semiconductor device using the conventional head slider assembly described above.

Figure 2:
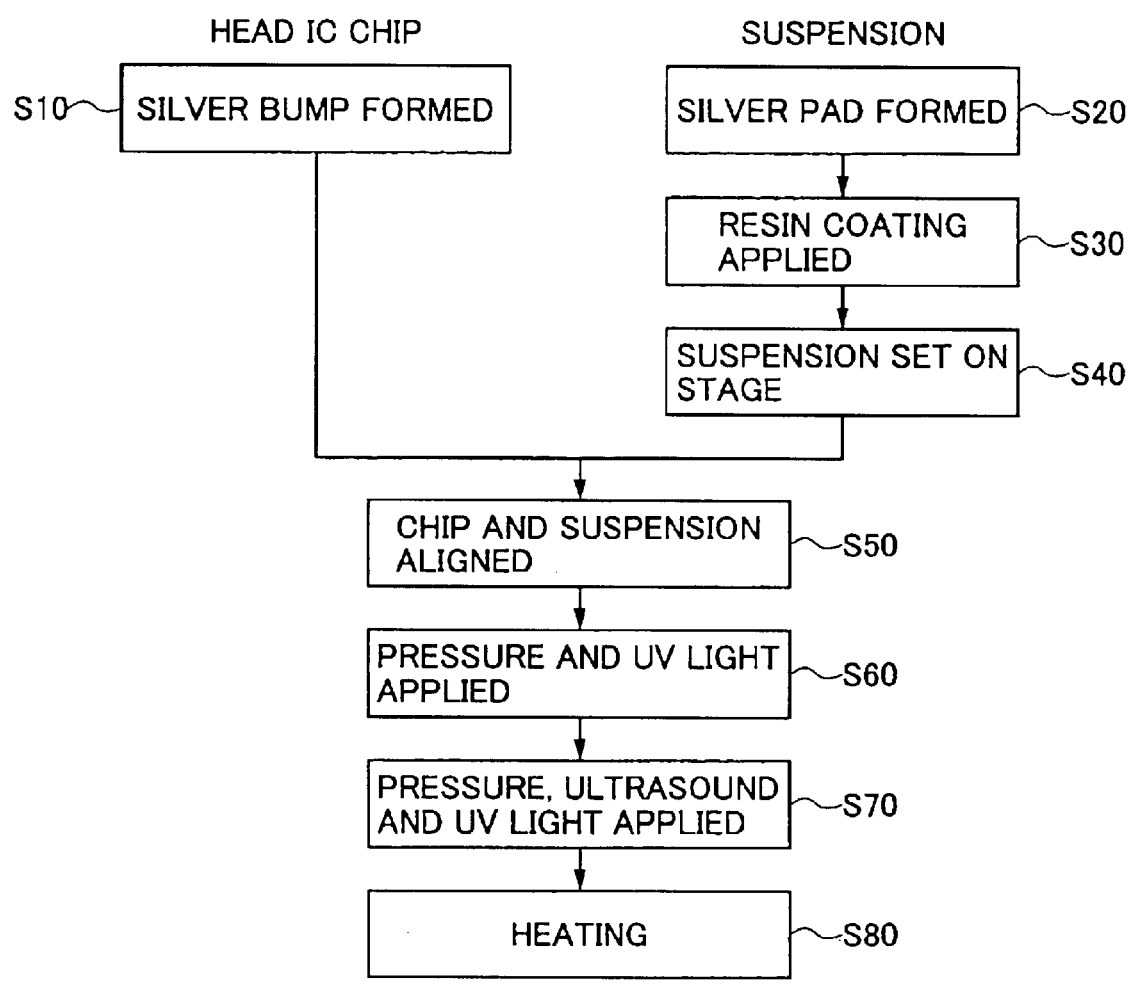
FIG. 2 is a flow chart of steps involved in production of a semiconductor device when mounting a semiconductor element on the printed wiring board, including a resin coating step as per each of the embodiments of the present invention.

FIG. 2 is a flow chart of steps involved in production of a semiconductor device when mounting a semiconductor element on the printed wiring board, including a resin coating step as per each of the embodiments of the present invention.

Using a wire bonding device, a gold bump is formed on a bottom surface of a head IC chip in a step S10.

At the same time, a gold pad is formed on a wiring pattern on a top surface of the suspension in a step S20. Next, a resin coating is applied as an underfill in a center of a portion to be mounted on the head IC chip on a side of the suspension on which the gold pad is formed in a step S30. Then, the suspension is fixedly mounted atop a stage with the gold pad and resin coated part facing upward in a step S40.

The head IC chip is vacuum-attached to a bonding tool of a bonding unit and transported to a location of the suspension, where the head IC chip is aligned atop the suspension S50.

Figure 1:
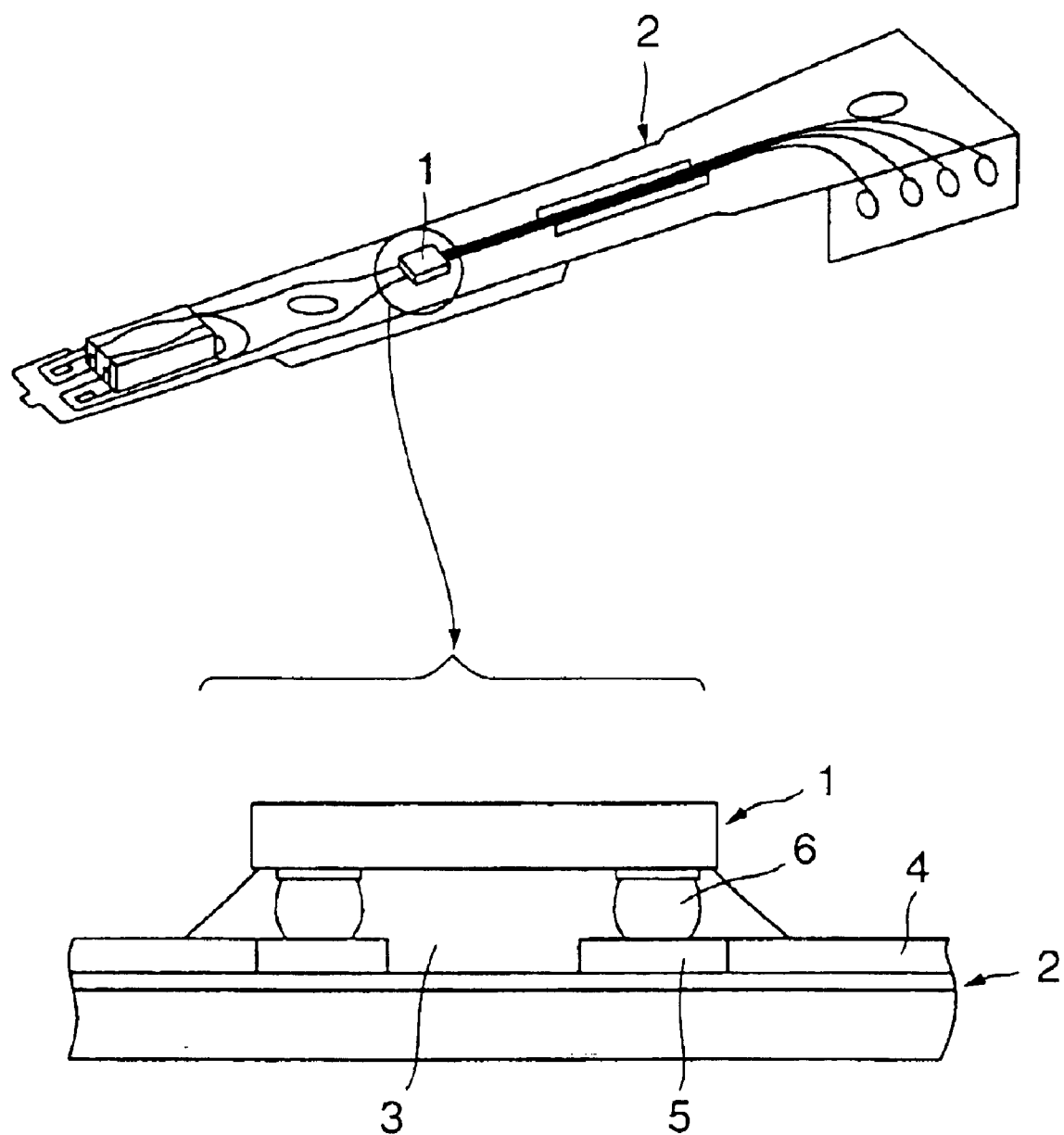
FIG. 1 is a diagram showing a conventional example of a small semiconductor element mounted atop a printed wiring board.

Lowering the bonding tool depresses the head IC chip, causing the gold bump to be pressed by the gold pad. At this time, the head IC chip spreads the resin. The resin spreads until it just protrudes from an outer periphery of the head IC chip (see FIG. 1). Additionally, at the same time as the head IC chip is pressed, the periphery of the head IC chip is subjected to ultraviolet light, causing that part of the resin protruding from the outer periphery of the head IC chip to partially harden in a step S60.

Next, the head IC chip is subjected to ultrasound vibration while under pressure so as to bond the gold bump and gold pad together in a step S70. It should be noted that the head IC chip continues to be exposed to ultraviolet light during this time.

Up to the present stage, except for that part of the resin that protrudes from the outer periphery of the head IC chip, the resin directly beneath the head IC chip remains unhardened, and thus provides no impediment to the above-described bonding of the gold bump and gold pad.

Finally, the head IC chip to which the suspension has been bonded is moved to a furnace and heated so as to harden the remaining unhardened portion of the resin, thus forming the underfill and completing assembly of the head slider assembly in a step S80.

A description will now be given of a basic structure and function of a resin coating apparatus used in executing the resin coating method according to the present invention.

Figure 3:
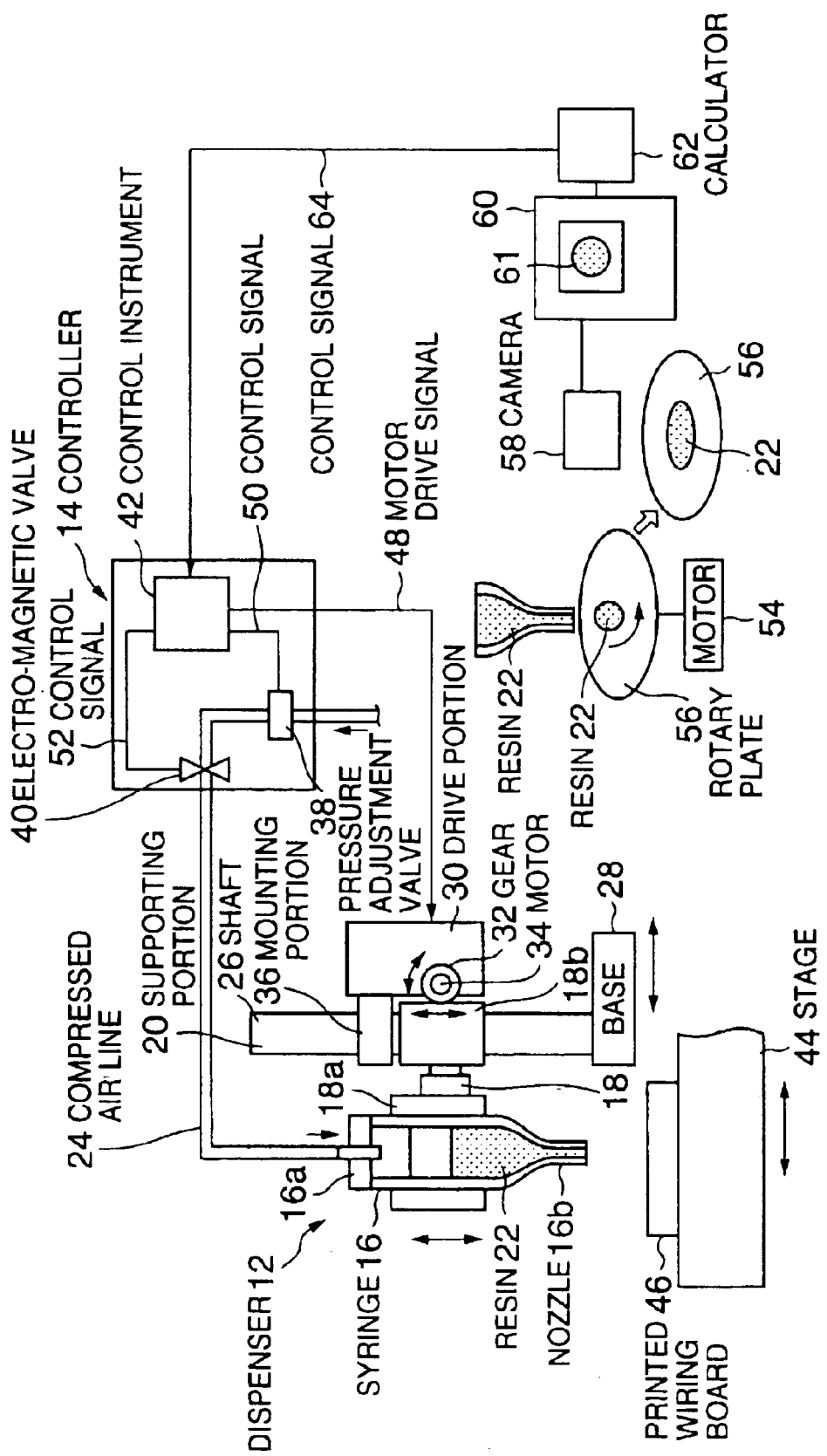
FIG. 3 is a schematic diagram of a resin coating apparatus used to perform a resin coating method according to the first embodiment of the present invention.

FIG. 3 is a schematic diagram of a resin coating apparatus used to perform a resin coating method according to the first embodiment of the present invention.

As shown in the diagram, the resin coating apparatus 10 comprises chiefly a dispenser 12 and a controller 14 that controls the movement of the dispenser 12.

The dispenser 12 includes a syringe 16, a retaining portion 18 that grasps the syringe 16, and a supporting portion 20 that can raise and lower the retaining portion 18.

The syringe 16 may for example be formed to a substantially cylindrical shape using a plastic material, and is filled with a predetermined volume of a coating resin 22. An upper end of the syringe 16 is sealed by a lid 16a, with a nozzle 16b formed at a lower end for the purpose of extruding the resin 22 therefrom. One end of a compressed air line 24 is detachably attached to the lid 16a. For descriptive convenience, a detailed description of the compressed air line 24 is deferred until later. The syringe 16 is clamped by the retaining portion 18. When the resin 22 has been used up and the syringe 16 becomes empty, the empty syringe 16 is removed from the retaining portion 18 and replaced with a new syringe 16 filled to a predetermined volume with the resin 22. One end 18a of the retaining portion 18 retains the syringe 16 while the other end of the retaining portion 18b is supported in such a way as to ascend and descend along a shaft 26 of the supporting portion 20 to be described later.

The supporting portion 20 includes a base 28, the above-described shaft 26 rising from the base 28, and a drive portion 30 that ascends and descends.

The base 28 is driven by a drive source not shown in the diagram, such that, for example, the base 28 is mobile along a rail. The drive portion 30 is provided with a motor 34 having a gear 32, and is fixedly mounted at a predetermined position along the shaft 26 by a mounting portion 36. The other end 18b of the retaining portion 18 is cylindrical in shape and mounted so as to be slidable along the shaft 26, with a gear groove formed on an outer periphery of the end 18b (though not shown in the diagram) engaging the gear 32 of the motor 34. As a result, when the motor 34 is activated and causes the gear 32 to rotate, the retaining portion 18 is raised or lowered accordingly. The movement of the motor 34 of the supporting portion 20 is controlled by the controller 14 as described below.

The compressed air line 24 is connected, for example, to a 0.6 MP source of pressurized air. A pressure adjustment valve 38 is provided on an upstream side of the compressed air line 24 and an electromagnetic valve 40 is provided on a downstream side. The pressure adjustment valve 38 and the electromagnetic valve 40 together comprise one part of the controller 14.

In addition to the pressure adjustment valve 38 and the electromagnetic valve 40, the controller 14 is also provided with a control instrument 42 that controls the movement of the motor 34 of the supporting portion 20.

It should be noted that the resin coating apparatus 10 is provided with a stage 44 capable of being moved by a motive source not shown in the diagram. A plurality of printed wiring boards 46 are provided on the stage 44 (although only one is shown in FIG. 3), so that by moving the stage 44 the printed wiring boards 46 are also moved, thus permitting a plurality of printed wiring boards 46 to be coated with resin continuously.

A resin application process employing the resin coating apparatus 10 having the structure described above, is performed according to the following general order.

First, a plurality of printed wiring boards 46 are positioned atop the stage 44.

Second, a fresh syringe 16 filled with a predetermined volume of resin 22 is installed at the retaining portion 18.

The resin 22 may for example by composed of an acryl component, with each syringe filled with, for example, 5 ml of resin 22. With this one syringe 16, for example, approximately 80,000 printed wiring boards 46 can be coated with resin 22.

Third, one end of the compressed air line 24 is connected to the lid 16a of the syringe 16.

Fourth, the following coating operation is carried out based on a program installed in a CPU of the control instrument 42 of the controller 14.

The motor 34 is driven by a motor drive signal 48 from the control instrument 42. The position to which the syringe 16, which is driven by the motor 34, is raised or lowered is numerically controlled. The syringe 16, which is positioned at a predetermined height position, is then lowered until a tip of the nozzle 16b attains a predetermined distance from the printed wiring board, for example 150 $\mu$m, at which point lowering of the nozzle 16b is halted.

The compressed air line 24 is controlled so as to operate according to the specifications of the printed wiring board 46 to be processed, in such a way that control signals 50, 52 from the control instrument 42 set the degree of opening of the pressure adjustment valve 38 as well as the open-and-close cycles of the electromagnetic valve 40. For example, when the air pressure is reduced to approximately 0.5 Mpa, the electromagnetic valve 40 is kept open for 60 ms and then closed for 1440 ms, in a cycle that repeats itself. As a result, a predetermined volume of resin 22 is extruded from the syringe 16 and coats the printed wiring board 46. The conditions under which air is sent to the syringe 16, in other words, adjustment of the amount of resin extruded from the nozzle 16b of the syringe 16 by compressed air, for example in a case in which the amount of the coating is increased, can involve either increasing the extent of the opening of the pressure adjustment valve 38 so as to raise the pressure of the air sent into the syringe, or changing the cycle of the electromagnetic valve 40 to keep the electromagnetic valve 40 open longer, or both. Of these two types of adjustments, readjusting the cycle of the electromagnetic valve 40 yields relatively more precise adjustment of the amount of resin extruded, in other words, is the easier of the two ways of adjusting the amount of resin 22 used.

The predetermined amount of resin 22 extruded from the nozzle 16b of the syringe 16 by compressed air temporarily assumes the shape of a ball of resin 22, with a top part attached to the nozzle 16b. A bottom part of the resin 22 thereafter contacts the printed wiring board 46 and attaches itself thereto. The syringe 16 is then raised, causing the resin 22 to separate from the nozzle 16b and spread over the surface of the printed wiring board 46.

A description will now be given of a resin coating method according to a first embodiment of the present invention, with reference to the same FIG. 3.

In order to perform the resin coating method according to the first embodiment of the present invention, the resin coating apparatus 10 described above additionally and further has a rotary plate (stage) 56 driven by a motor 54, a camera (imaging means) 58 for taking a photograph (i.e., an image) of the rotary plate 56; and a monitor 60 for looking at (i.e., examining) the image obtained by the camera 58. The monitor 60 is equipped with an image analyzer which produces digitized information from each picture element of the image and which is processed by calculator 62 which sends a control signal 64 to the control instrument 42.

Figure 4:
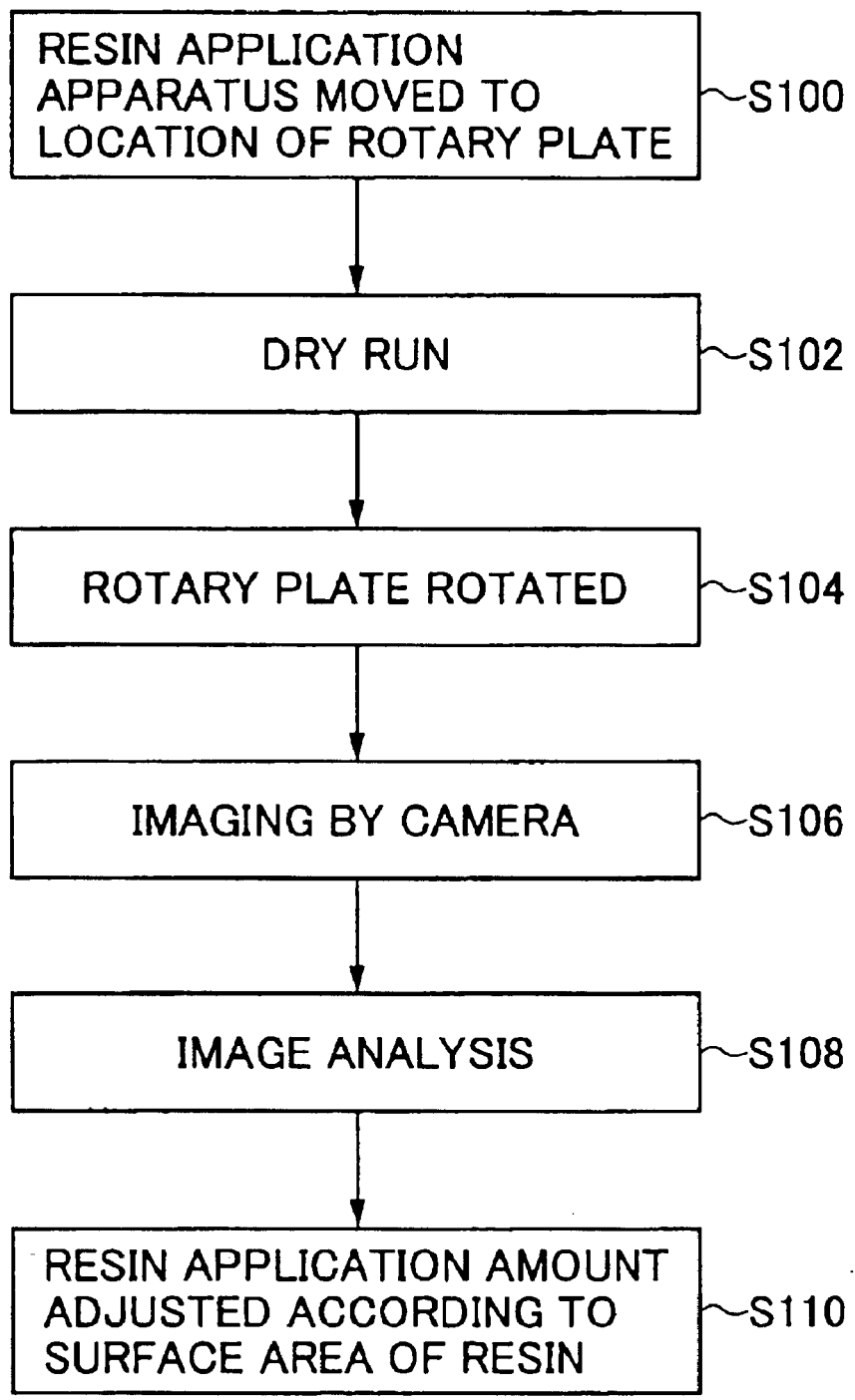
FIG. 4 is a flow chart showing steps in a resin coating method according to the first embodiment of the present invention.

FIG. 4 is a flow chart showing steps in a resin coating method according to the first embodiment of the present invention.

As shown in FIG. 4, the resin coating method according to the first embodiment of the present invention involves an imaging step S106 in which the external appearance of the resin 22 extruded from the resin coating apparatus 10 is photographed and a step S110 in which the application amount of resin 22 extruded from the resin coating apparatus 10 is adjusted based on the external appearance obtained in the imaging step S106, in other words, the coating amount is automatically adjusted. Further, in this case, prior to the imaging step S106 the resin 22 is stretched across the rotary plate 56 in a step S104, and the surface area of the resin 22 spread across the top of the rotary plate 56 after the imaging step S106 is measured in a step S108.

In other words, when for a variety of reasons it is deemed necessary to check for variation in the coating amount of the resin and to adjust the coating amount accordingly, the resin coating apparatus 10 is moved and the syringe 16 positioned at the rotary plate 56 in a step S100. Then the resin 22 is extruded under programmed actual coating conditions onto the rotary plate 56 in a so-called dry run step S102. The dry run is carried out as appropriate whenever for any reason a change occurs in the amount of resin coating the printed wiring boards during a production line run. Additionally, the dry run may also be carried out on a regular and periodic basis for the purpose of checking and adjusting the amount of resin used in the coating, for example a dry run once every ten printed wiring board coatings.

During a dry run, depending on the state of rotation of the rotary plate 56, centrifugal force causes the extruded resin 22 to elongate across the surface of the rotary plate 56 in the step S104. The spread resin 22 develops into a thin disc-like shape. In this case, the thickness of the resin 22 remains virtually unchanged and uniform even if there is a change in the amount of resin used in the coating. Accordingly, by noting changes in the surface area of the resin 22 it is possible to note any changes in the coating amount of resin 22 as well.

As described above, the external appearance of the resin 22 is photographed with the camera 58 in the step S106 and the resulting image analyzed in the step S108. The image so acquired is used to determine the surface area of the resin 22 spread across the surface of the rotary plate 56. Ordinarily, when the measurement object is irregular, it is necessary to scan the entire image in order to obtain an approximation of its surface area. However, according to the present embodiment, the surface area can be obtained using just the diameter of the substantially circular shape formed by the spreading resin 22, thus making image analysis easy and quick.

Based on the surface area data obtained as described above, a correlation is found between surface area and coating amount by referring to a table of such correlations. Any difference between the predetermined programmed coating amount and the actual coating amount as obtained from the surface area data is sent to the control instrument 42, and the control instrument 42 used to reset the open-and-close cycle of the electromagnetic valve 40 in order to reacquire, or re-establish, the correct, that is, the predetermined coating amount in a step S110.

More specifically, when for example the coating amount obtained from the surface area data is less than the predetermined programmed coating amount, in other words when the amount of resin extruded during the production line run is less than a predetermined coating amount, then the program is changed so that the amount of time during which the electromagnetic valve 40 is open is lengthened to a degree corresponding to the amount of the shortfall in the coating volume, with application of the resin 22 thereafter carried out under the new coating conditions.

According to the resin coating method according to the first embodiment of the present invention as described above, the amount of resin 22 extruded from the resin coating apparatus 10 is automatically adjusted according to the external appearance of the resin, so there is no lag in taking corrective action. Additionally, change in the surface area of the resin, that is, change in the amount of resin 22 used in coating the printed wiring board 46, can be quantified and understood accurately, and the amount of resin 22 used in the coating adjusted precisely.

A description will now be given of a variation of the resin coating method according to the first embodiment of the present invention.

Figure 5:
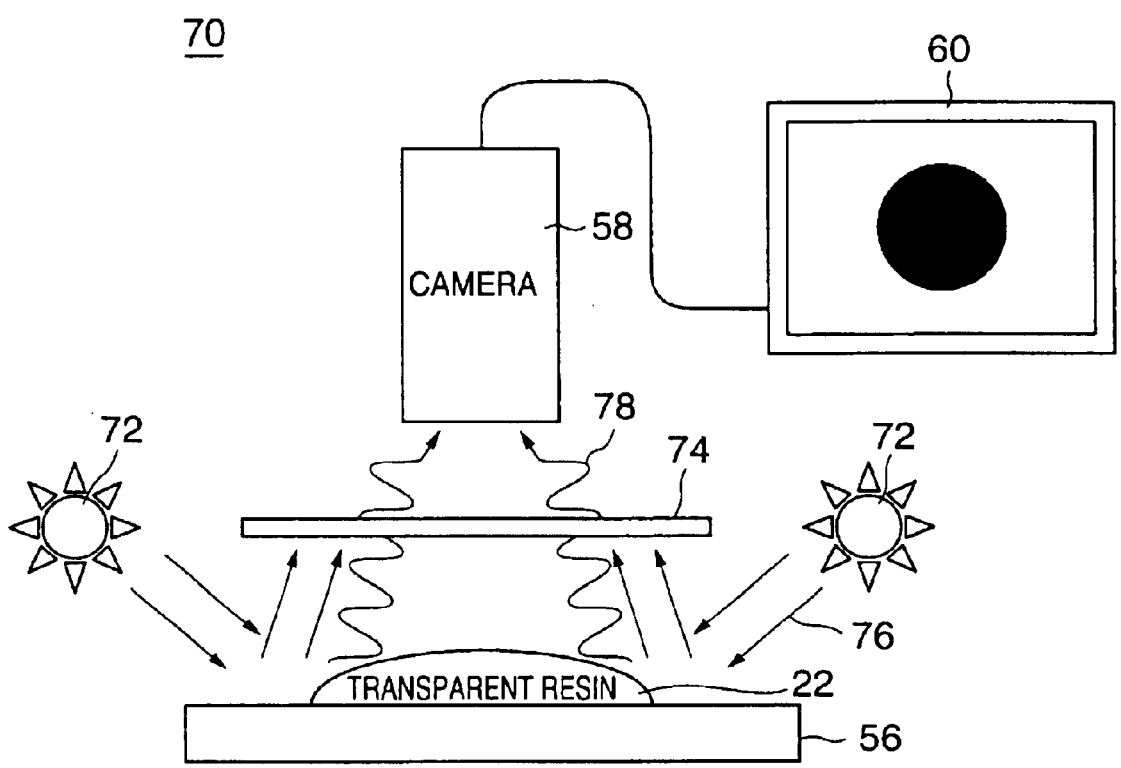
FIG. 5 is a schematic diagram of a resin coating apparatus used to perform a resin coating method according to a variation of the first embodiment of the present invention.

FIG. 5 is a schematic diagram of a resin coating apparatus used to perform a resin coating method according to a variation of the first embodiment of the present invention.

The basic structure of the resin coating apparatus 70 used to perform the variation of the resin coating method according to the first embodiment of the present invention is essentially identical to the resin coating apparatus 10 used in the first embodiment, though with certain additions to be described below.

The resin coating apparatus 70 is provided with one or more xenon lamps 72. In the case of the resin coating apparatus 72 shown in FIG. 5, there are two such xenon lamps 72. Additionally, a filter 74 that only passes fluorescent light 78 is either installed directly on the camera 58 or provided separately from the camera 58 in a space between the camera 58 and the rotary plate 56.

In the imaging step S106 described above, the resin coating method according to the variation of the first embodiment projects light of a predetermined wavelength onto the resin 22 so as to cause the resin 22 to fluoresce, separates the generated fluorescent light from light of other wavelengths, obtains a fluorescent image of the resin 22 and uses the fluorescent image to measure the surface area of the resin 22.

That is, light of a predetermined wavelength is generated using a xenon lamp or lamps 72 as a light source, thus projecting xenon light 76 onto the resin 22 and the rotary plate 56. The rotary plate 56 is, for example, a metallic plate, and so despite absorbing a portion of the xenon light 76 nevertheless reflects substantially all of the xenon light 76. By contrast, the resin 22 reflects the xenon light 76 and generates fluorescent light 78 from the energy of the absorbed xenon light 76.

Of the xenon light 76 and fluorescent light 78 that reaches the filter 74, only the fluorescent light 78 passes through the filter 74 and is captured by the camera 58. Thereafter the process of applying a coating of resin 22 onto the printed wiring board 46 is the same as for the resin coating method according to the first embodiment of the present invention as described above.

In the event that the resin 22 has color, then there is no need for special processing like that described for the variation of the first embodiment as above. If, however, the resin 22 is transparent, then exposure to sunlight will turn virtually every picture element pertaining to the images of the resin 22 and the rotary plate 56 substantially totally white, making the image difficult to identify. Nevertheless, according to the above-described variation of the first embodiment of the present invention, even in the event that the resin 22 is transparent the same effects and advantages as with the first embodiment of the present invention can be obtained.

It should be noted that, in a case in which the lots of resin 22 are mixed, that is, some are transparent and others colored, then, according to the above-described variation of the first embodiment of the resin coating method as described above, the same resin coating apparatus 70 can still be used without interruption.

A description will now be given of a resin coating method according to a second embodiment of the present invention.

Figure 6:
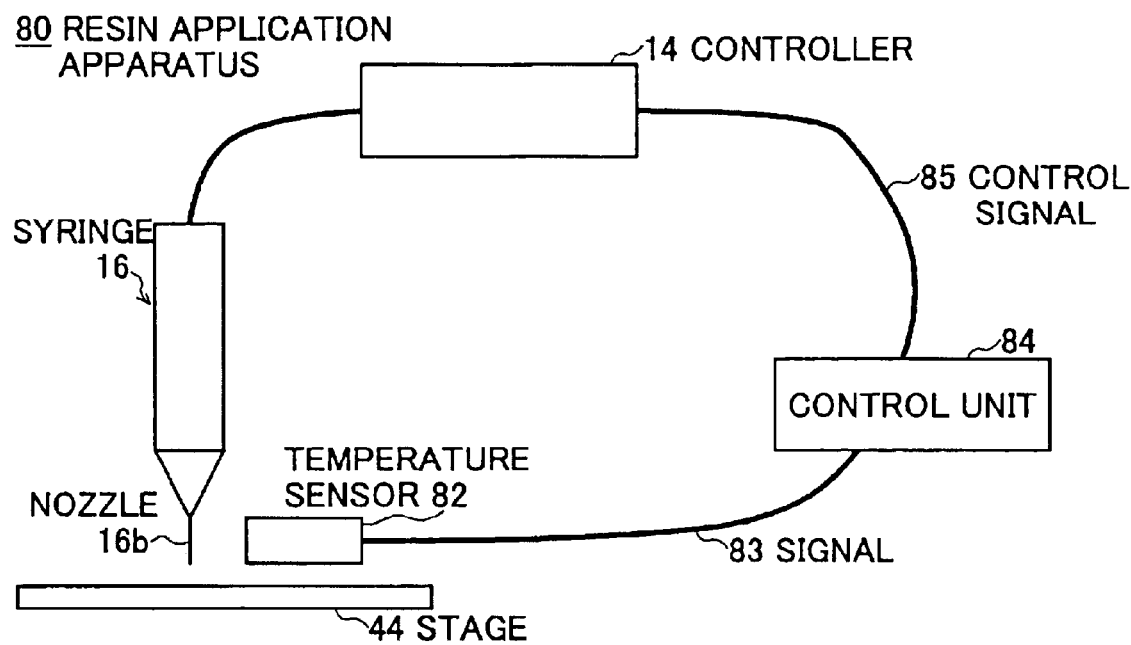
FIG. 6 is a schematic diagram of a resin coating apparatus used to perform a resin coating method according to a second embodiment of the present invention.
Figure 7:
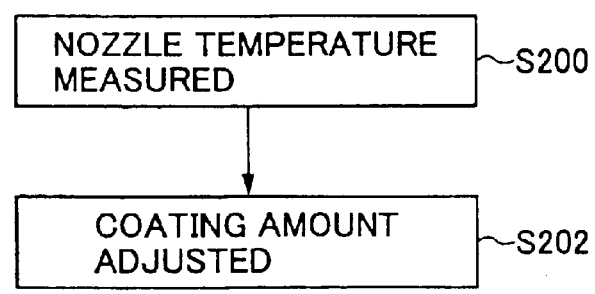
FIG. 7 is a flow chart showing steps in a resin coating method according to the second embodiment of the present invention.

FIG. 6 is a schematic diagram of a resin coating apparatus used to perform a resin coating method according to a second embodiment of the present invention. FIG. 7 is a flow chart showing steps in a resin coating method according to the second embodiment of the present invention.

The basic structure of a resin coating apparatus 80 used to perform the resin coating method according to the second embodiment of the present invention is essentially unchanged from that of the resin coating apparatuses 10, 70 described above. However, the apparatus 80 does additionally comprise a temperature sensor 82 and a control unit 84.

The temperature sensor 82, for example, may optimally be a radiation thermometer. The temperature sensor 82 is positioned so as to be able to sense a surface temperature at the tip of the nozzle 16b. Signals 83 of the temperature data detected by the temperature sensor 82 are sent to the control unit 84. The control unit 84 is equipped with a reference table for correcting the amount of resin 22 used in the coating depending on the surface temperature of the tip of the nozzle 16b, specifically, in this case, as with the first embodiment, transmitting to the control instrument 14 a control signal that changes the open-and-close cycle schedule of the electromagnetic valve 40 as appropriate.

As shown in FIG. 7, the resin coating method according to the second embodiment of the present invention comprises a step S200 in which the temperature of the nozzle 16b of the resin coating apparatus 80 is measured and a step S202 in which the amount of the coating is adjusted automatically on the basis of the temperature data obtained in the nozzle temperature measurement step S200.

In other words, the temperature at the nozzle 16b of the resin coating apparatus 80 is measured by the temperature sensor 82 at appropriate intervals. The control unit 84 then resets the cycle of the electromagnetic valve 40 depending on the temperature measured, sending a signal to that effect to the controller 14, changing the cycle of the electromagnetic valve 40 and adjusting the amount of resin 22 extruded from the resin coating apparatus 80. Coating thereafter continues subject to the new conditions.

According to the resin coating method according to the second embodiment of the present invention, changes in the temperature of the nozzle 16b with repeated coating applications that in turn cause the viscosity of the resin 22 to change and the amount of resin 22 extruded from the nozzle 16b to vary are offset by sensing the temperature at the nozzle 16b and automatically adjusting the amount of resin 22 extruded therefrom. Thus a relatively simple device and method suffices to support accurate and timely corrective action with respect to the amount of resin 22 extruded from the resin coating apparatus 80.

A description will now be given of a resin coating method according to a third embodiment of the present invention.

Figure 8:
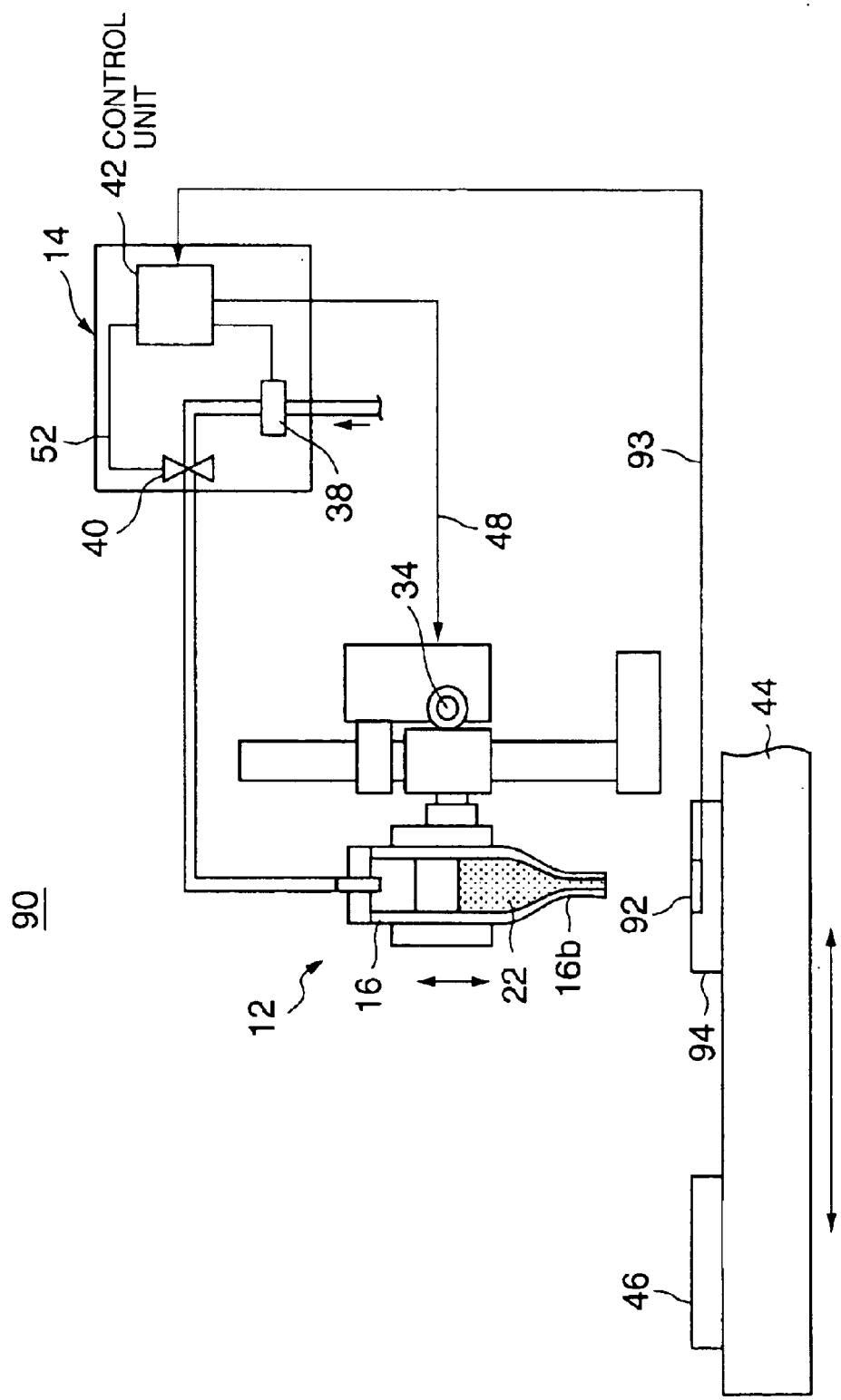
FIG. 8 is a schematic diagram of a resin coating apparatus used to perform a resin coating method according to a third embodiment of the present invention.

FIG. 8 is a schematic diagram of a resin coating apparatus used to perform a resin coating method according to the third embodiment of the present invention. FIG. 9 is a flow chart showing steps in a resin coating method according to the third embodiment of the present invention.

In order to perform the resin coating method according to the third embodiment of the present invention, a resin coating apparatus 90 is used that has essentially the same basic structure as the resin coating apparatuses described above but with the addition of a mechanism for positioning the tip of the nozzle 16b at a predetermined height.

The height-positioning mechanism further comprises a glass plate 94 mounting a magnetorestrictor 92.

The glass plate 94 is positioned together with a wiring board 46 at a height identical to a height of the wiring board 46 atop the stage 44. In other words, the glass plate 94 serves as a reference surface (that is, a predetermined reference height) at time of coating. When the tip of the nozzle 16b from which the resin 22 is extruded contacts the glass plate 94, that is, the magnetorestrictor 92, the pressing of the magnetorestrictor 92 generates an electric current. The controller 14 receives a signal 93 of the current so generated and interrupts the drive of the motor 34, resets the reference height set in the controller 14 program with the new reference height data and generates a motor drive signal that raises the nozzle 16b a predetermined amount.

A description will now be given of the resin coating method according to the third embodiment of the present invention, with reference to FIG. 9.

When the syringe 16 becomes empty of resin 22, the syringe 16 is replaced by a fresh syringe 16 from the dispenser 12 in a step S300. Next, the stage 44 is moved and the glass plate 94 placed directly beneath the fresh syringe 16 in a step S302. The motor 34 is then started and the syringe 16 is gradually lowered in a step S304. When the tip of the nozzle 16b of the syringe 16 contacts the magnetorestrictor 92 in a step S306 and the magnetorestrictor 92 is pressed and restricted, an electric current is generated in the magnetorestrictor 92. An electrical signal 93 based on the electric current so generated is then transmitted to the controller 14. The controller 14 temporarily interrupts the drive of the motor 34, replaces the reference height data, and generates a motor drive signal that raises the nozzle 16b by a predetermined amount. In so doing, the syringe 16 that is driven by the motor 34 is raised to a predetermined height with respect to the newly set reference height and maintained at that height position for subsequent coating operations in a step S308.

According to the resin coating method according to the third embodiment of the present invention, when the height at which the tip of the nozzle 16b is positioned changes, either because, for example, the syringe 16 containing the resin 22 used for coating becomes empty and is replaced with a new syringe 16 or for some other reason, the tip of the nozzle 16b is maintained at a predetermined height with respect to a reference surface when installed on the resin coating apparatus 90. Thereafter the syringe 16, which is positioned at a predetermined height above the reference surface, is then lowered a predetermined amount by the control program. As a result, the distance between the tip of the nozzle 16b and the printed wiring board 46 is maintained at a predetermined value even after the syringe has been replaced, so no change in the amount of resin 22 used in coating the printed wiring board 46 occurs.

A description will now be given of a resin coating method according to a fourth embodiment of the present invention.

Figure 10B:
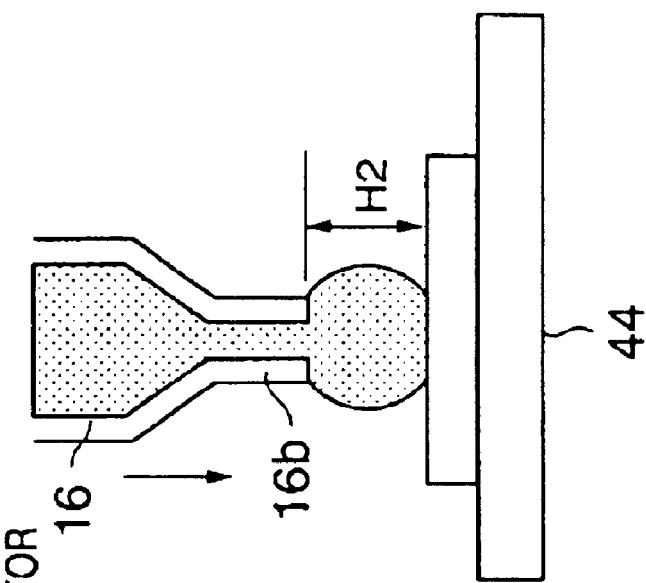
Figure 10A:
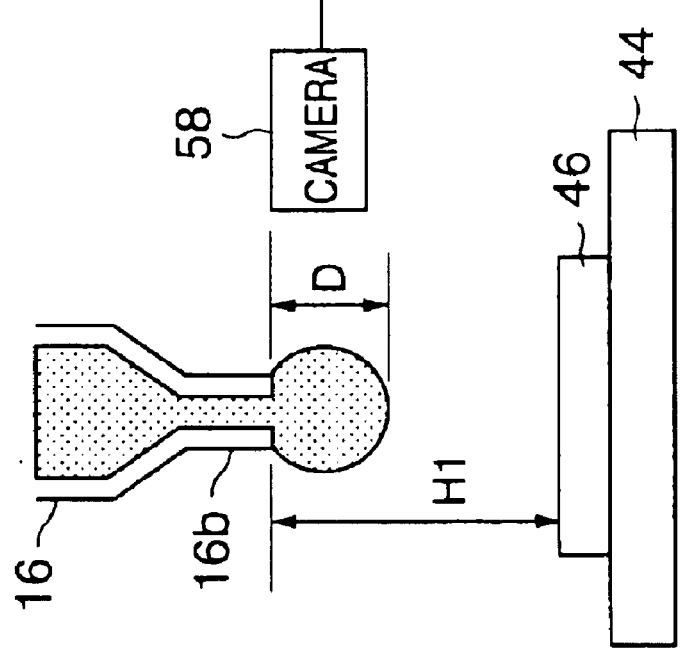

FIGS. 10A and 10B are diagrams of a resin coating apparatus used to perform a resin coating method according to the fourth embodiment of the present invention, in which FIG. 10A shows a state prior to coating and FIG. 10B shows a state at time of coating.

The resin coating apparatus 100 used to perform the resin coating method according to the fourth embodiment is essentially the same as the resin coating apparatus 10 used to perform the resin coating method according to the first embodiment as described above, with the addition however of a camera 58, a monitor 60 and a calculator 62. As shown in the diagrams, the camera 58 is positioned at the tip of the nozzle 16b from which the resin 22 is extruded.

A description will now be given of the resin coating method according to the fourth embodiment of the present invention, using the resin coating apparatus 100 described above, with reference to FIGS. 10A and 10B as well as FIG. 11.

FIG. 11 is a flow chart showing steps in a resin coating method according to the fourth embodiment of the present invention.

Before the nozzle 16b is lowered to a resin coating height H2 at a predetermined distance between the nozzle 16b and the printed wiring board 46, the resin 22 is extruded from the nozzle 16b at an arbitrary height H1 (FIG. 10A). At this time the extruded resin 22 forms substantially a ball shape, with a top part of the ball attached to the tip of the nozzle 16b in a step S400.

The ball of resin 22 is then photographed by the camera 58 and, through image analysis, a diameter D of the ball of resin 22 is obtained in a step S402 by calculator 62.

A control signal 101 transmitted from the calculator 62 to the controller 14 based on the diameter data D obtained in the step S402, causing the syringe 16 to be lowered to the predetermined resin coating height H2 in a step S404, a height that corresponds to the diameter D. A bottom part of the resin 22 then contacts the printed wiring board, after which the syringe 16 is then raised, causing the resin 22 to separate from the nozzle 16b and spread across the printed wiring board 46, coating same, in a step S406 (FIG. 10B).

At this time, an upper limit of the predetermined resin coating height H2 is set by the requirement that the bottom part of the ball of resin 22 securely contact the printed wiring board 46 and, at the same time, that the ball of resin 22 definitely separate from the nozzle 16b when the syringe 16 is raised after the ball of resin 22 contacts the printed wiring board 46. On the other hand, a lower limit of the predetermined resin coating height H2 is set by the requirement that the resin not envelope the periphery of the nozzle 16b and become attached thereto when the resin 22 is held between the nozzle 16b and the printed wiring board 46. Accordingly, the desired height is determined as appropriate by experiment.

With the conventional resin coating method, when for any reason the distance between the tip of the nozzle and the printed wiring board to be coated is too short, the resin tends to stick to the tip of the nozzle after coating. If such a condition is allowed to continue through subsequent coating operations, then the amount of resin attached to the tip of the nozzle continues to accrete until suddenly dropping from the nozzle onto the printed wiring board, creating an abnormal coating thereon.

By contrast, the resin coating method according to the fourth embodiment of the present invention prevents the above-described situation from occurring by setting the distance between the tip of the nozzle 16b and the printed wiring board 46 to be, for example, substantially equal to the diameter D of the ball of resin 22 at the tip of the nozzle 16b, thus preventing build-up of the resin 22 at the nozzle 16b.

A description will now be given of a resin coating method according to a fifth embodiment of the present invention.

Figure 12:
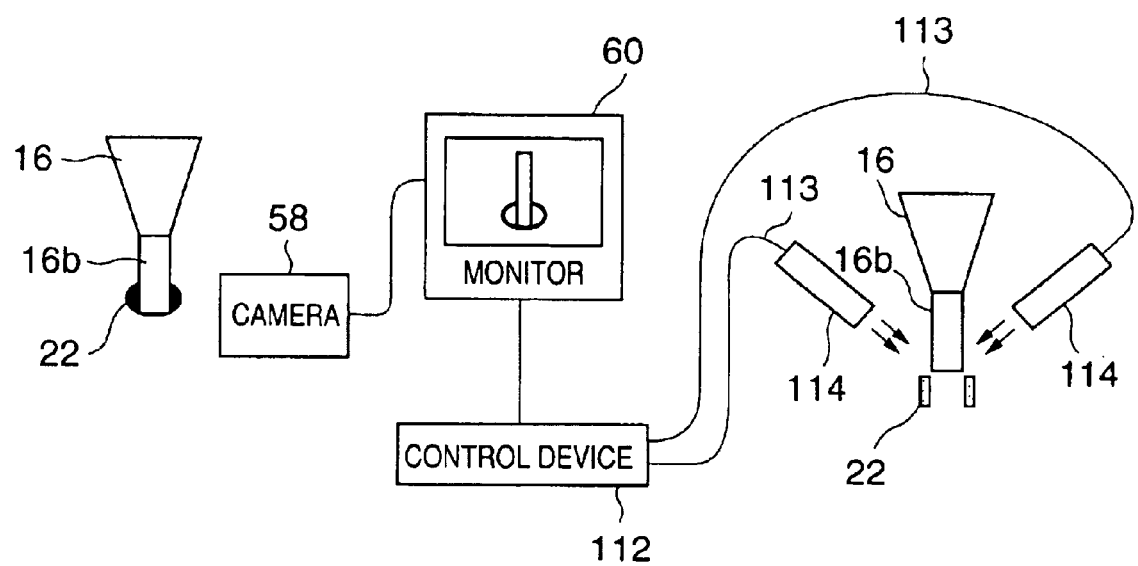
FIG. 12 is a schematic diagram of a resin coating apparatus used to perform a resin coating method according to a fifth embodiment of the present invention.

FIG. 12 is a schematic diagram of a resin coating apparatus used to perform a resin coating method according to a fifth embodiment of the present invention.

As shown in the diagram, the resin coating apparatus 110 used to perform the resin coating method according to the fifth embodiment of the present invention is essentially the same as the resin coating apparatus 10 used to perform the resin coating method according to the first embodiment as described above, with the addition however of a camera 58, a monitor 60 and, further, a control device 112 and a washing unit.

As shown in the diagram, the camera 58 is positioned at the tip of the nozzle 16b of the syringe 16 from which the resin 22 is extruded. The control device 112 measures the amount of residual resin attached to end 16b of the nozzle 16 through image analysis, compares the measured amount to a predetermined value, and transmits a signal to the washing unit to wash the nozzle end 16b if the measured amount exceeds the predetermined value. The washing unit is equipped with a washing nozzle 114 that sprays the nozzle end 16b with washing fluid.

A description will now be given of the resin coating method according to the fifth embodiment of the present invention, using the resin coating apparatus 110 described above, with reference to FIG. 12 and FIG. 13.

Figure 13:
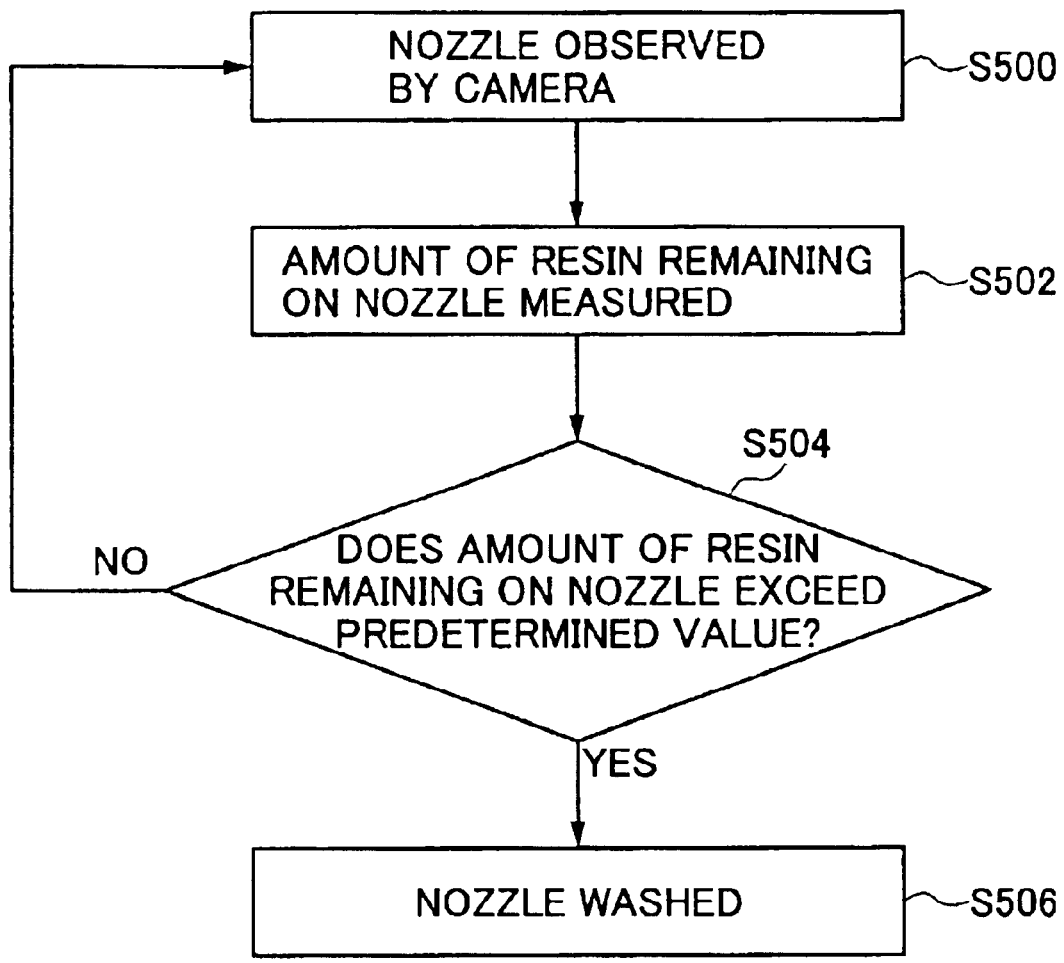
FIG. 13 is a flow chart showing steps in a resin coating method according to the fifth embodiment of the present invention.

FIG. 13 is a flow chart showing steps in a resin coating method according to the fifth embodiment of the present invention.

In a step S500 the camera 58 is positioned so as to observe the external appearance of the nozzle 16b of the syringe 16.

The amount of resin 22 remaining on the periphery of the end 16b of the nozzle 16 is quantified by the monitor 60 and the control device 112 in a step S502.

The control device 112 determines whether the amount of resin 22 attached to the nozzle 16b exceeds a predetermined value S504 and, if not, continues surveillance of the nozzle 16b by the camera 58. If, however, the amount of resin adhering to the nozzle exceeds the predetermined value, then the control device 112 transmits a wash signal 113 to the washing unit, so that the washing nozzle 114 sprays the nozzle end 16b with washing fluid to remove resin 22 attached to the nozzle 16b.

The above description is provided in order to enable any person skilled in the art to make and use the invention and sets forth the best mode contemplated by the inventors of carrying out the invention.

The present invention is not limited to the specifically disclosed embodiments, and variations and modifications may be made without departing from the scope and spirit of the present invention.

The present application is based on Japanese Priority Application No. 2000-293013, filed on Sep. 26, 2000, the contents of which are hereby incorporated by reference.

What is claimed is:

1. A resin coating method for applying resin to a predetermined amount of resin region of on a printed wiring board, comprising the steps of:

applying a controlled amount of resin on a printed wiring board by extruding the resin from a resin application device;

spreading said resin on said printed wiring board by centrifugal force;

imaging an external appearance of the resin, as spread on the printed wiring board;

determining a surface area of the spread and imaged resin; and automatically adjusting the controlled amount of the resin based on the determined surface area of the spread and imaged resin.

2. the resin coating method as claimed in claim 1, wherein the imaging step comprises:

exposing the resin to light of a predetermined wavelength so as to fluoresce the resin; and separating fluorescent light so generated from light of other wavelengths to obtain a fluorescent image of the resin.

3. A resin coating method as recited in claim 1, further comprising:

applying the resin by extruding same from a nozzle of they resin application device, the extruded resin being in the form of a ball attached to the nozzle and displaced above and separated from the printed wiring board.

4. A resin coating method as recited in claim 3, further comprising:

lowering the nozzle so as to attach a bottom part of the ball to the printed wiring board and raising the nozzle so as to separate same from the resin ball.

5. A resin coating method for applying resin to a predetermined amount of resin region of on a printed wiring board, comprising the steps of:

imaging an external appearance of a resin drop after the resin drop has been extruded from a nozzle of a resin application device but before the resin drop contacts the printed wiring board; and determining a diameter of the resin drop from the image thereof;

adjusting a distance between a tip of the nozzle and the printed wiring board based on the determined diameter of the resin drop obtained in the determining step.

6. A resin coating method as recited in claim 5, further comprising:

applying the resin by extruding same from a nozzle of the resin application device, the extruded resin being in the form of a ball attached at a top part thereof to the nozzle and displaced above and separated from the printed wiring board.

7. A resin coating method as recited in claim 6, further comprising:

lowering the nozzle so as to attach a bottom part of the ball to the printed wiring board and raising the nozzle so as to separate same from the ball.

8. A resin coating method as recited in claim 7, wherein the imaging is performed by measuring the diameter of the resin ball.

9. A resin coating method as recited in claim 7, further comprising:

spreading the resin ball to a uniform thickness layer; and determining the amount of the applied resin in accordance with the measured diameter and a correlation table relating to the latter to an amount.

10. A resin coating method for applying a predetermined amount of resin to a predetermined region of on a printed wiring board, comprising the steps of:

imaging a residual amount of the resin on an extrusion nozzle of a resin application device from which the resin is expelled; and washing the nozzle when the residual amount exceeds a predetermined amount.

11. A resin coating method as recited in claim 10, further comprising:

applying the resin by extruding same from the nozzle of the resin application device, the extruded resin being in the form of a ball attached at a top part thereof to the nozzle and displaced above and separated from the printed wiring board.

12. A resin coating method as recited in claim 11, further comprising:

lowering the nozzle so as to attach a bottom part of the ball to the printed wiring board and raising the nozzle so as to separate same from the ball.

* * * * *

UNITED STATES PATENT AND TRADEMARK OFFICE
CERTIFICATE OF CORRECTION

PATENT NO. : 6,770,319 B2
DATED : August 3, 2004
INVENTOR(S) : Shunji Baba et al.

It is certified that error appears in the above-identified patent and that said Letters Patent is hereby corrected as shown below:

Column 15,
Line 1, change "the" to -- The --
Line 11, change "they" to -- a --.

Signed and Sealed this

Fourteenth Day of December, 2004

JON W. DUDAS
*Director of the United States Patent and Trademark Office*